US009337076B2

(12) United States Patent
Buonodono et al.

(10) Patent No.: US 9,337,076 B2
(45) Date of Patent: May 10, 2016

(54) WORKPIECE SUPPORT STRUCTURE WITH FOUR DEGREE OF FREEDOM AIR BEARING FOR HIGH VACUUM SYSTEMS

(71) Applicant: Varian Semiconductor Equipment Associates, Inc., Gloucester, MA (US)

(72) Inventors: James P. Buonodono, Amesbury, MA (US); Michael Esposito, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 278 days.

(21) Appl. No.: 13/798,909

(22) Filed: Mar. 13, 2013

(65) Prior Publication Data

US 2014/0265093 A1    Sep. 18, 2014

(51) Int. Cl.
*H01L 21/687* (2006.01)
*H01J 37/30* (2006.01)
*H01J 37/317* (2006.01)

(52) U.S. Cl.
CPC ........... *H01L 21/68764* (2013.01); *H01J 37/30* (2013.01); *H01J 37/3171* (2013.01); *H01J 2237/2005* (2013.01); *H01J 2237/20207* (2013.01); *H01J 2237/20228* (2013.01); *H01J 2237/20235* (2013.01); *H01J 2237/20242* (2013.01)

(58) Field of Classification Search
CPC .................. H01J 37/20; H01J 37/3171; H01J 2237/20207; H01J 2237/2005; H01J 2237/20235; H01J 2237/202472; H01J 2237/20214; H01J 2237/20221; H01L 21/68764; H01L 21/67213; H01L 21/68; H01L 21/68792
See application file for complete search history.

(56) References Cited

U.S. PATENT DOCUMENTS

| | | | | |
|---|---|---|---|---|
| 5,001,350 | A * | 3/1991 | Ohi et al. | 250/440.11 |
| 5,581,088 | A * | 12/1996 | Kasai | 250/440.11 |
| 6,163,033 | A * | 12/2000 | Smick et al. | 250/441.11 |
| 6,469,309 | B1 * | 10/2002 | Kasai | 250/442.11 |
| 6,555,825 | B1 * | 4/2003 | Mitchell et al. | 250/398 |
| 6,669,121 | B2 * | 12/2003 | Kasai | 250/442.11 |
| 6,740,894 | B1 * | 5/2004 | Mitchell | 250/492.21 |
| 7,030,395 | B2 * | 4/2006 | Deak, IV | 250/492.21 |
| 7,253,419 | B2 * | 8/2007 | Takahashi | 250/442.11 |
| 7,851,769 | B2 * | 12/2010 | Schmid et al. | 250/442.11 |
| 7,997,227 | B2 * | 8/2011 | Bruce et al. | 118/723 EB |
| 8,563,407 | B2 * | 10/2013 | Hertel et al. | 438/527 |
| 8,816,299 | B1 * | 8/2014 | Buonodono et al. | 250/442.11 |
| 2014/0264069 | A1 * | 9/2014 | Buonodono et al. | 250/430 |

* cited by examiner

*Primary Examiner* — Joseph J Hail
*Assistant Examiner* — Marc Carlson

(57) ABSTRACT

A workpiece adjustment assembly is disclosed. The assembly can include a shaft, a spherical bearing, and a wafer support. A spherical housing receives the spherical bearing and allows the bearing to rotate therein. The housing and bearing may form an air bearing. A seal may be formed in the housing to prevent gas from the air bearing and the ambient atmosphere from migrating to a process chamber side of the housing. A set of spherical air pads may be positioned on an ambient side of the bearing to press the bearing against the housing when the process chamber is not under vacuum conditions. The seal can include a set of differentially pumped grooves. The spherical bearing enables the wafer manipulation end, and a wafer attached thereto, to be moved with four degrees of freedom. The arrangement facilitates isocentric scanning of a workpiece. Methods for using the assembly are also disclosed.

20 Claims, 15 Drawing Sheets

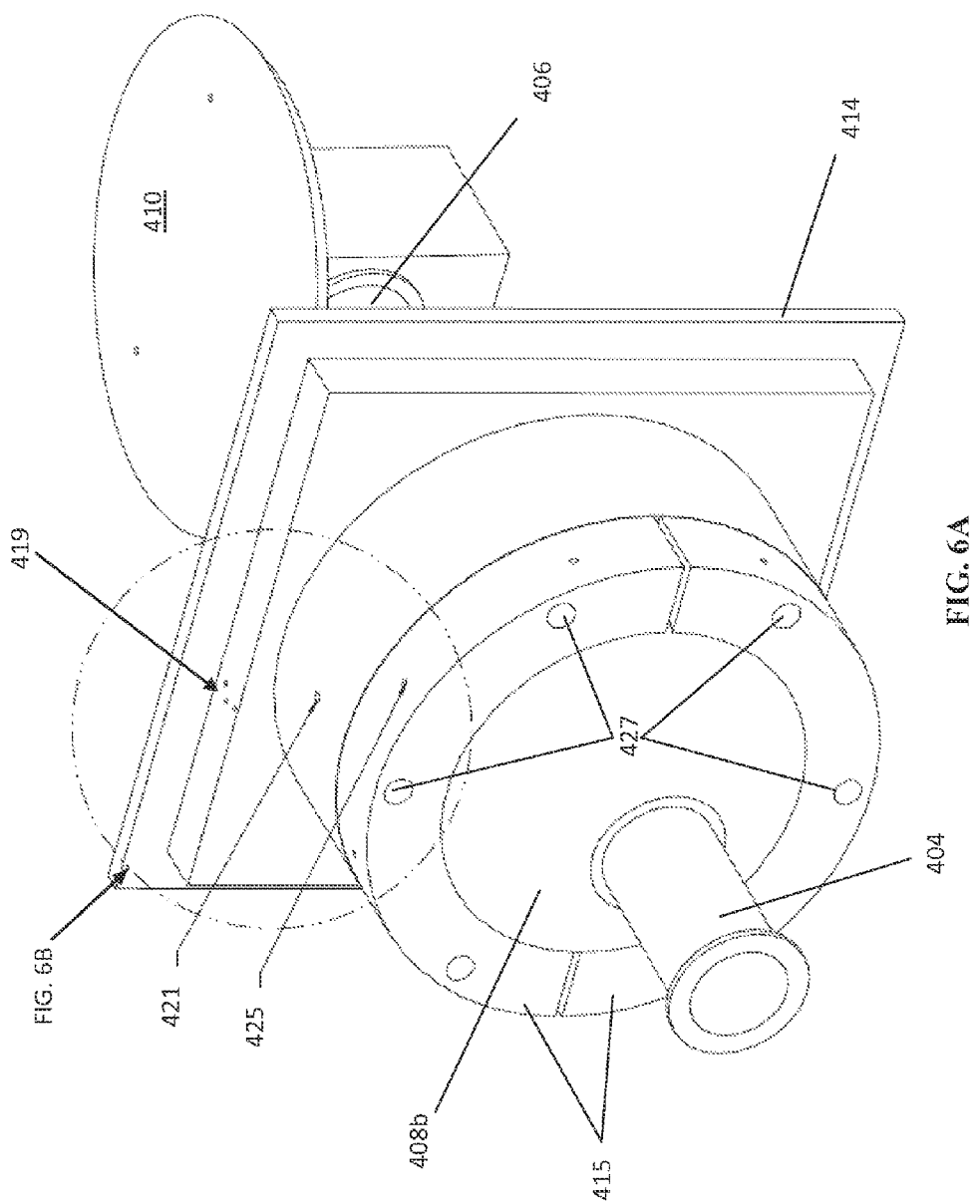

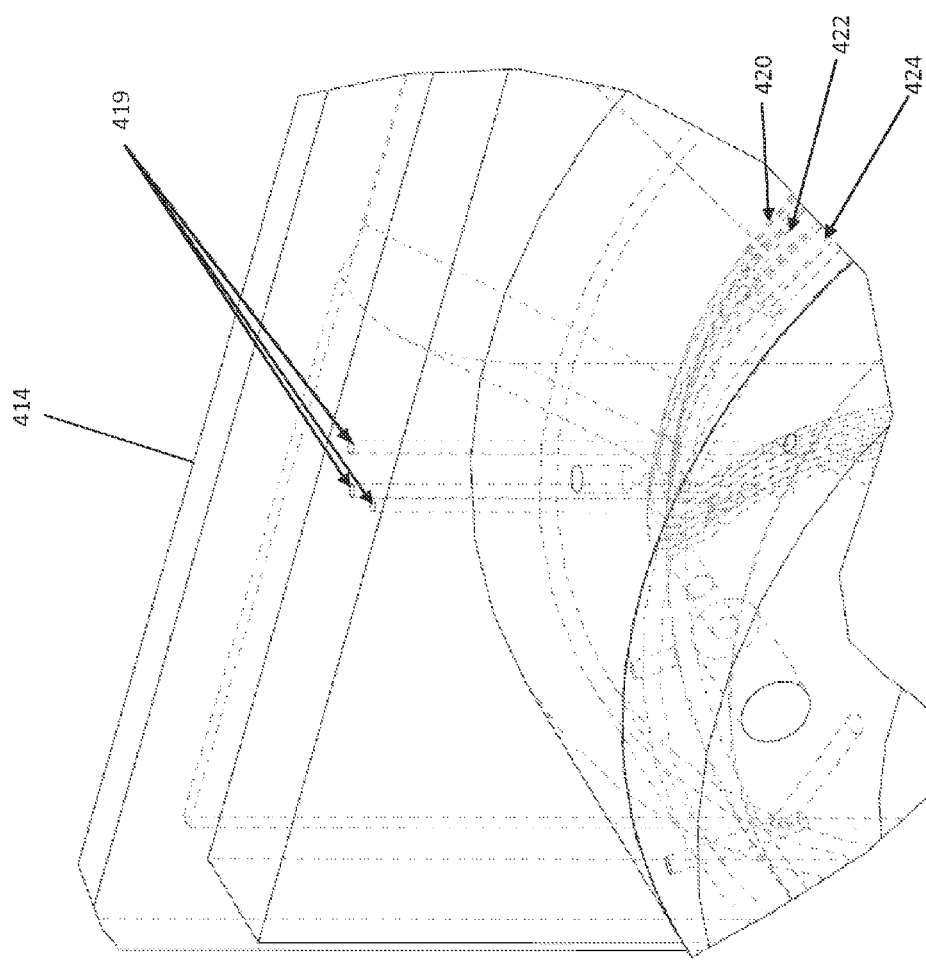

WORKPIECE SUPPORT STRUCTURE WITH FOUR DEGREE OF FREEDOM AIR BEARING FOR HIGH VACUUM SYSTEMS

BACKGROUND OF THE INVENTION

1. Field of the Invention

Embodiments of the invention relate to semiconductor processing in general, and in particular to a system for manipulating a workpiece during semiconductor processing applications.

2. Discussion of Related Art

Ion implantation is a process of depositing chemical species into a substrate by bombardment of the substrate with energized ions. In semiconductor manufacturing, ion implanters are used for doping processes that alter the type and level of conductivity of target materials. A precise doping profile in an integrated circuit (IC) substrate and its thin-film structure is important for proper IC performance. To achieve a desired doping profile, one or more ion species may be implanted in different doses and at different energy levels.

FIG. 1 depicts an ion implanter system. The ion implanter 100 includes a power source 101, an ion source 102, extraction electrodes 104, a 90 magnet analyzer 106, a first deceleration (D1) stage 108, a 70 magnet analyzer 110, and a second deceleration (D2) stage 112. The D1 and D2 deceleration stages (often referred to as "deceleration lenses") are each comprised of multiple electrodes with a defined aperture to allow an ion beam to pass through. By applying different combinations of voltage potentials to the multiple electrodes, the D1 and D2 deceleration lenses may manipulate ion energies and cause the ion beam 10 to hit a target workpiece 114 at a desired energy. A number of measurement devices 116 (e.g., a dose control Faraday cup, a traveling Faraday cup, or a setup Faraday cup) may be used to monitor and control the ion beam conditions. Although not shown in FIG. 1, the target workpiece 114 may be supported by a platen which can be used to fix and to move the workpiece during implantation.

To obtain a uniform distribution of dopant ions, an ion beam is typically scanned across the surface of a target workpiece. For example, an ion beam may be scanned back and forth in the X direction while the workpiece is translated in the Y direction, thereby forming a zigzag beam path pattern.

As the semiconductor industry is producing devices with smaller and smaller feature sizes, ion beams with lower energies are required for wafer implantation. Compared with high- or medium-energy ion beams, low-energy ion beams present some unique challenges. For example, a low-energy ion beam usually has a large beam spot, which can cause problems for beam utilization and uniformity tuning. In addition, the shape or current density of a low-energy ion beam can change substantially as it propagates down a beam line. As a result, if different portions of a wafer meet the low-energy ion beam at different positions along the beam line, different dopant profiles may be created for the different portions of the wafer.

This problem is illustrated in FIG. 2, wherein an ion beam 202 is propagating along the Z direction. If a workpiece (here, wafer 204) meets the ion beam 202 at a first position $Z=Z_1$, the wafer 204 will see a beam spot 206. If the wafer 204 meets the ion beam 202 at a second position $Z=Z_2$, for example, when the ion beam 202 is scanned across the surface of the wafer 204, the wafer 204 will see a beam spot 208 that may be quite different from the beam spot 206. Therefore, the portion of the wafer 204 implanted with the ion beam at beam spot 208 may have a different dopant profile from the portion implanted with the ion beam at beam spot 206. The problem of beam-line variation is not unique to low-energy ion beams but can also be observed in some high-current ion beams.

As a countermeasure to the beam-line variation problem, a concept known as "isocentric scanning" has been used. Isocentric scanning generally involves moving a wafer with respect to an ion beam in such a way that the point in space where the ion beam strikes the wafer surface remains the same no matter which part of the wafer surface meets the ion beam. FIG. 3 illustrates a complex movement of a tilted wafer 304 for isocentric scanning by an ion beam 302. The ion beam 302 propagates along the Z direction. For isocentric scanning, the wafer 304 is moved in such a way that the same beam spot (or ion beam cross section) 306 strikes the surface of the wafer 304. Since the wafer 304 is tilted with respect to the ion beam 302, the wafer 304 is moved not only in the X-Y plane, but also in the Z direction. For example, at position A, the center of the tilted wafer 304 may be at $Z=Z_A$. At position B, the center of the tilted wafer 304 may be at $Z=Z_B$ ($Z_B \neq Z_A$). The movement in the Z direction has to precisely coordinated with the movement in the X-Y plane in order to meet the isocentric scanning requirement.

To precisely control the tilting and the three-dimensional (3-D) translation of a wafer for isocentric scanning, existing ion implantation systems have to be equipped with a fairly complex end station to hold, tilt, and move the wafer. Such mechanisms must be capable of moving a wafer in all three dimensions. Such capabilities necessitate a sophisticated design of an end station that is often expensive to build and maintain. For example, current wafer scan systems use bearings having one or two degrees of freedom to achieve a desired wafer movement during implantation. To achieve a third degree of freedom, an additional bearing is added to the assembly, or an additional linear or rotary system is employed. Such arrangements add complexity and cost to the system. It would be desirable to provide an improved arrangement for performing isocentric ion beam scanning which overcomes the described inadequacies and shortcomings.

SUMMARY OF THE INVENTION

This Summary is provided to introduce a selection of concepts in a simplified form that are further described below in the Description of Embodiments. This Summary is not intended to identify key features or essential features of the claimed subject matter, nor is it intended as an aid in determining the scope of the claimed subject matter.

A workpiece adjustment assembly is disclosed. The assembly may include a shaft portion having an actuation end and a wafer manipulation end. A spherical bearing portion may be coupled to the shaft portion between the actuation end and the wafer manipulation end. A wafer support may be coupled to the wafer manipulation end of the shaft portion. A spherical housing portion may be provided for receiving the spherical bearing portion and for enabling the spherical bearing portion to rotate therein. The spherical housing portion may further include a plurality of openings adjacent the spherical bearing portion for providing a pressurized gas between the spherical housing portion and the spherical bearing portion. A seal may be disposed in the spherical housing portion for preventing the pressurized gas from migrating to a process chamber side of the housing portion. The spherical bearing portion may enable the wafer manipulation end to be moved with four degrees of freedom.

A workpiece adjustment assembly is disclosed. The assembly may include a shaft portion having an actuation end and a wafer manipulation end, a spherical bearing portion connected to the shaft portion, a wafer support coupled to the wafer manipulation end of the shaft portion, and a housing having a vacuum chamber side and an ambient side. The housing may also include a spherical housing portion adjacent to the vacuum chamber side for rotatably receiving the spherical bearing portion. The spherical housing portion may form an air bearing with the spherical bearing portion. The assembly may further include a seal disposed in the spherical housing portion for preventing gas from migrating to a process chamber side of the housing portion. The spherical bearing portion may enable the wafer manipulation end to be moved with four degrees of freedom.

A method is disclosed for manipulating a workpiece. The method may include engaging a workpiece with a workpiece support in a process chamber under high vacuum; and scanning the workpiece through an ion beam by manipulating a spherical bearing portion connected to the workpiece support; wherein the spherical bearing portion is configured to enable to the workpiece support to be moved with four degrees of freedom.

BRIEF DESCRIPTION OF THE DRAWINGS

The accompanying drawings illustrate preferred embodiments of the disclosed method so far devised for the practical application of the principles thereof, and in which:

FIG. 6A is a reverse isometric view of the wafer manipulation assembly of FIG. 4;

FIG. 6B is a partial transparent detail view of a portion of the wafer manipulation assembly of FIG. 6A;

DESCRIPTION OF EMBODIMENTS

Figure 1:
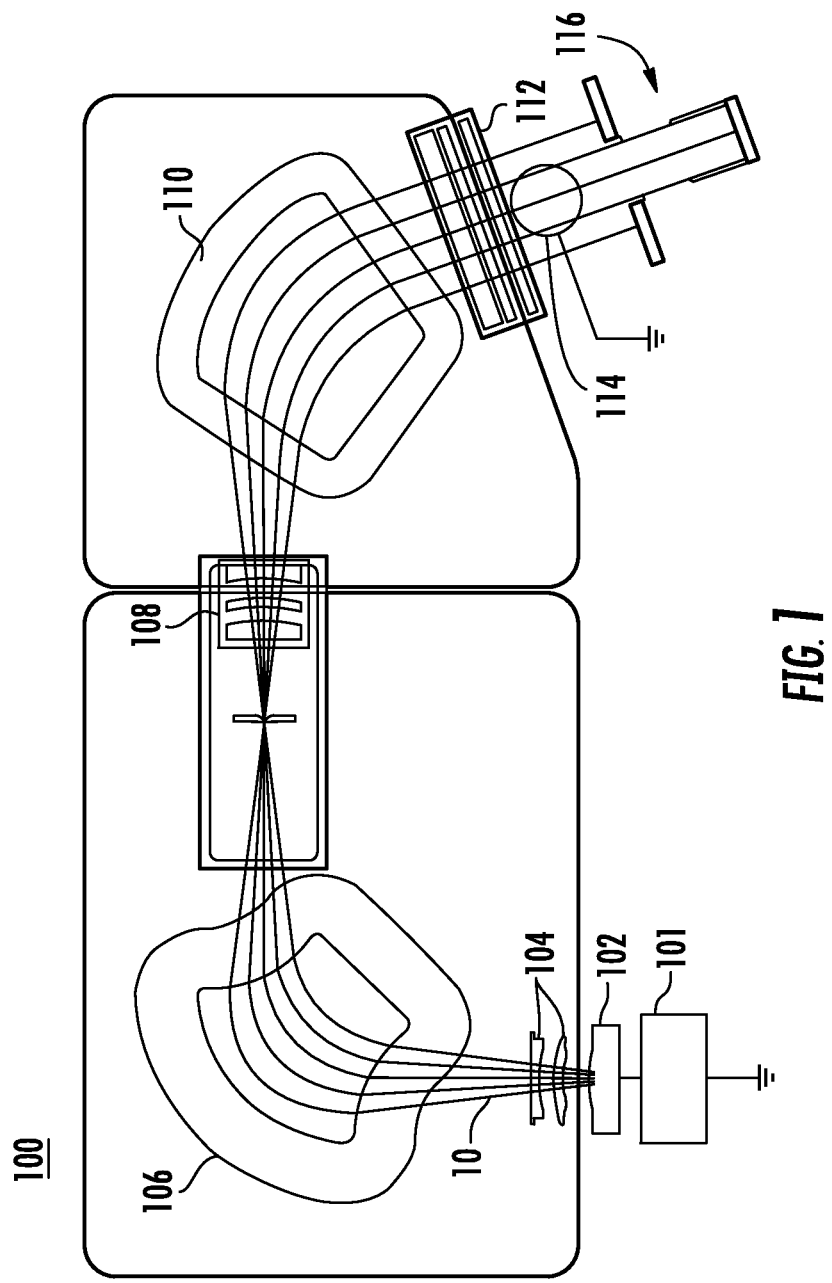
FIG. 1 is a schematic illustration of an exemplary ion implant system.
Figure 2:
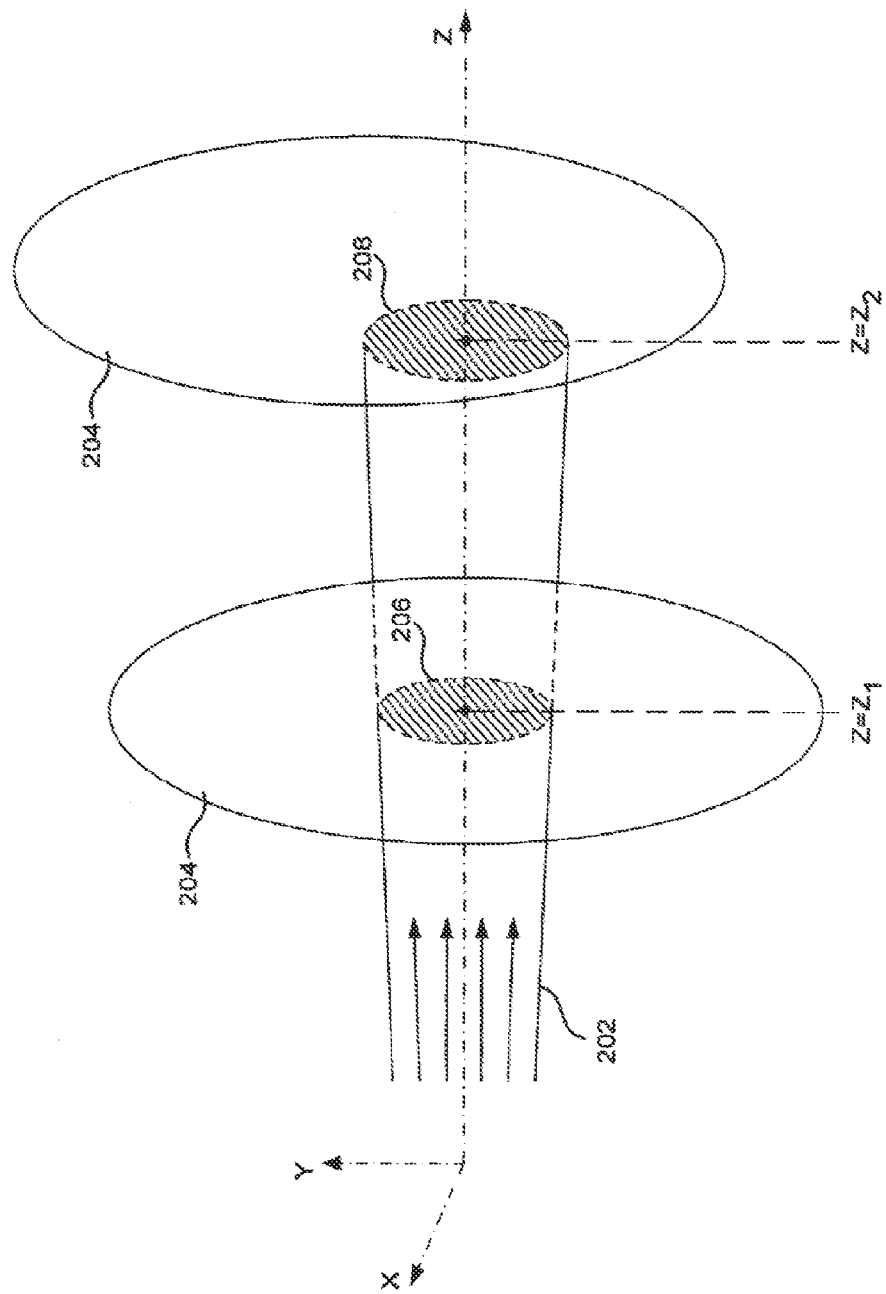
FIG. 2 illustrates beam-line variation in an ion beam.
Figure 3:
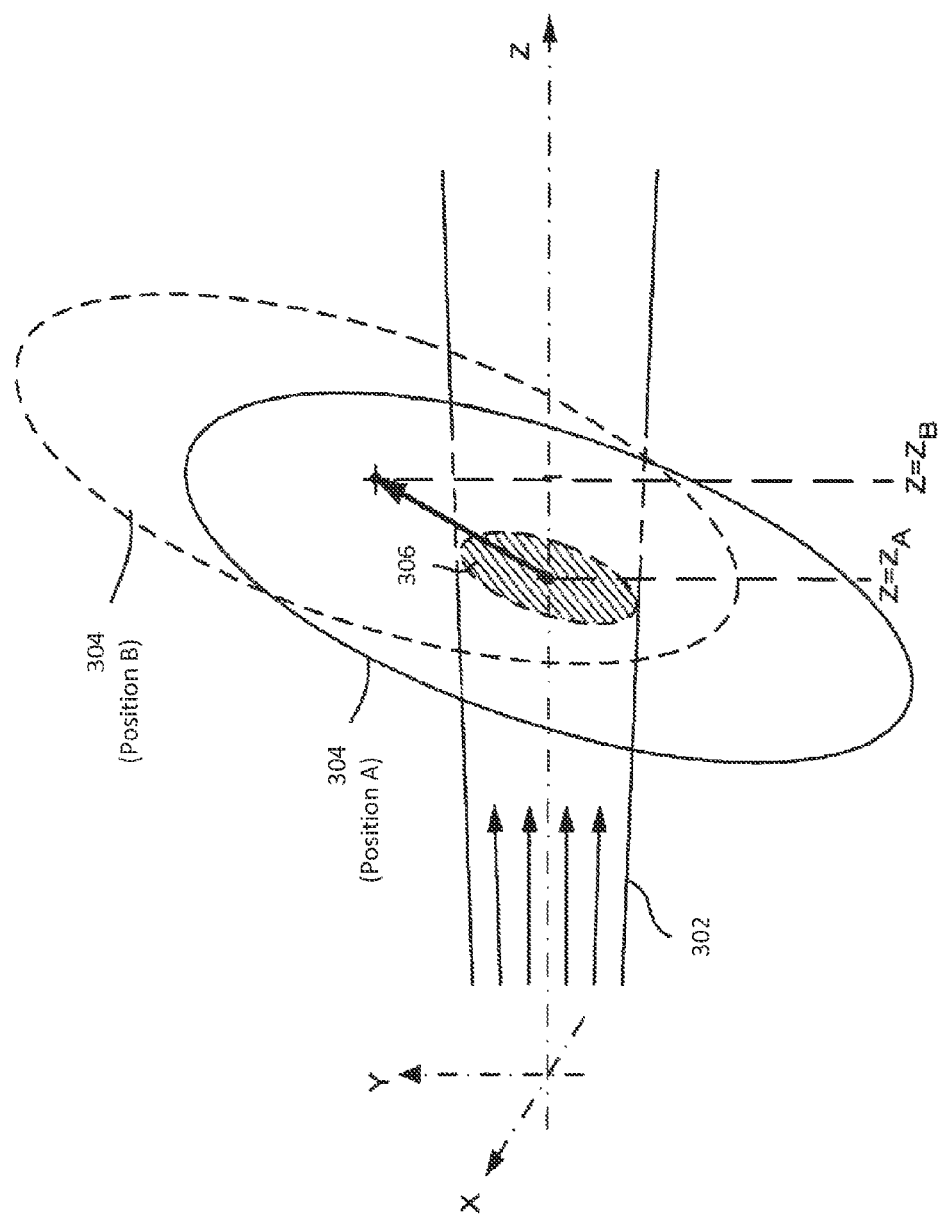
FIG. 3 illustrates a complex movement of a tilted wafer for isocentric ion beam scanning.
Figure 4:
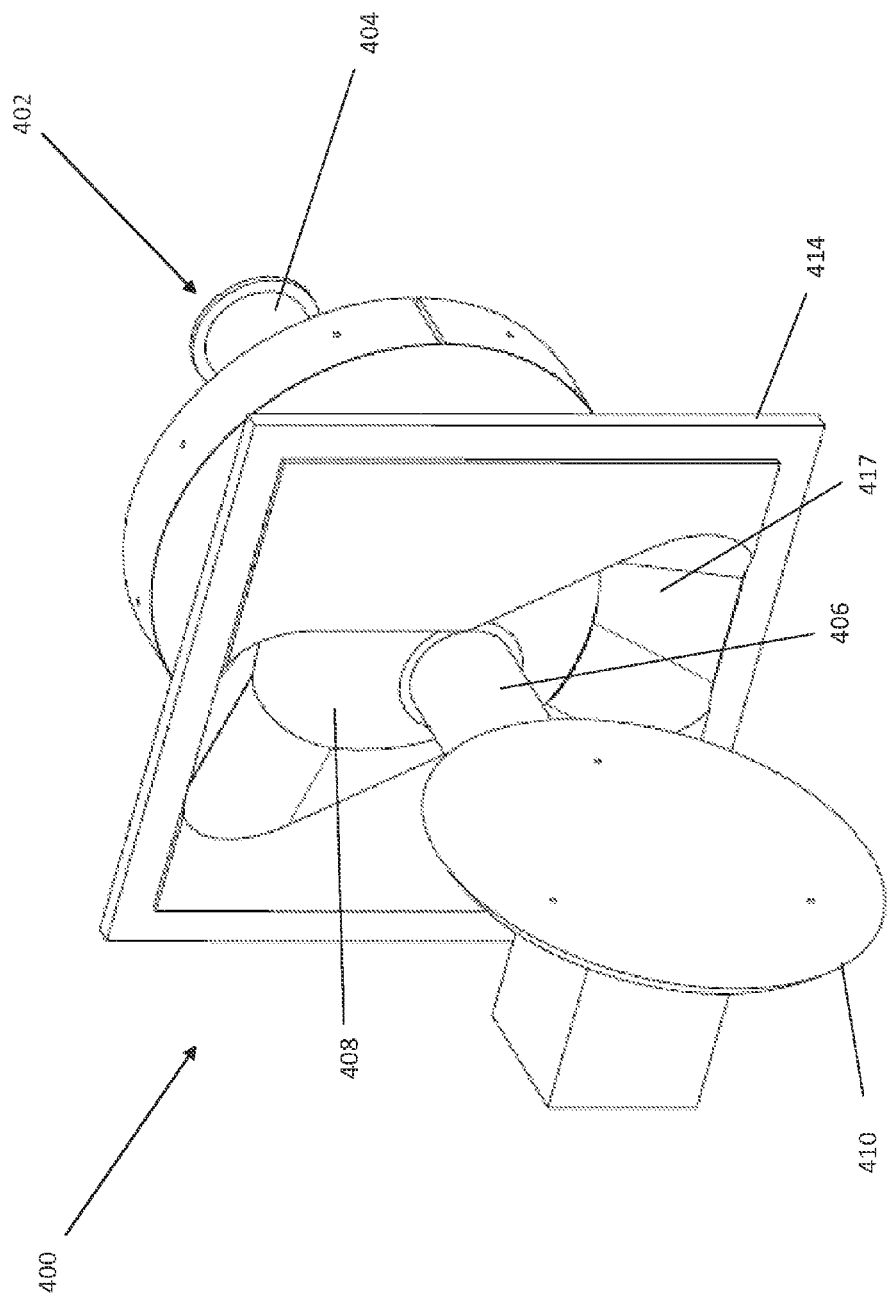
FIG. 4 is an isometric semi-transparent view of a wafer manipulation assembly according to the disclosure.
Figure 5:
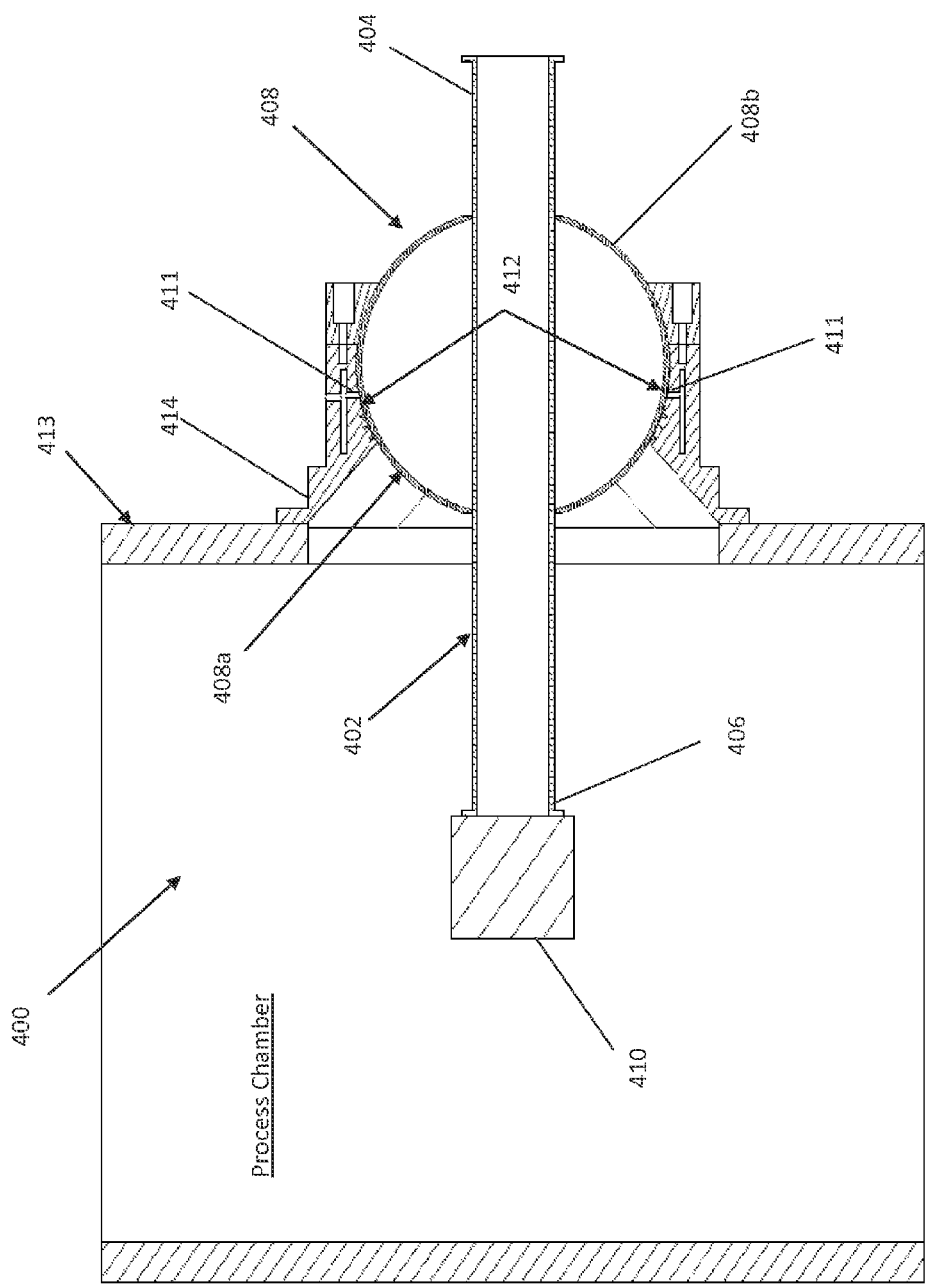
FIG. 5 is an isometric cutaway view of the wafer manipulation assembly of FIG. 4.

Referring now to FIGS. 4 and 5, a workpiece adjustment assembly 400 is shown. The assembly 400 may include a shaft portion 402 having an actuation end 404 and a wafer manipulation end 406. A spherical bearing portion 408 may engage the shaft portion 402 between the ends 404, 406. A wafer support 410 may be provided on the shaft portion 402 at or near the wafer manipulation end 406. In the illustrated embodiment, the shaft portion 402 is received through the center of the spherical bearing portion 408 and the two are separate pieces. It will be appreciated, however, that the shaft portion 402 and the spherical bearing portion 408 could also be formed as a single piece.

The spherical bearing portion 408 may be received by a complementary sized and shaped spherical recess 412 (FIG. 5) in a housing 414 which can be integrated into the wall 413 of a process chamber, such that the wafer support 410 is located inside the process chamber while the actuation end 404 of the shaft portion 402 is located outside the process chamber. The interaction between the spherical bearing portion 408 and the spherical recess 412 allows for isocentric motion of the wafer support (see FIGS. 8 and 9) during implant operations. The housing portion 414 may include an hourglass-shaped recess 417 that accommodates movement of the shaft portion 402 during this isocentric scanning motion. Thus arranged, by manipulating the actuation end 404 of the shaft portion 402 the position of a wafer held by the wafer support 410 can be adjusted with respect to an incident ion beam in a variety of desired positions and orientations.

As can be seen, the spherical bearing portion 408 mates with the spherical recess 412 of the housing 414 in a manner that allows the bearing to freely rotate and angulate with respect to the housing. In one embodiment, the spherical bearing portion 408 and spherical recess 412 constitute an air bearing in which a film of pressured air supports the load of the spherical bearing portion 408, the shaft portion 402 and the wafer support 410. Thus, under normal operating conditions there is no solid-to-solid contact between the spherical bearing portion 408 and the spherical recess 412. In one embodiment, the pressurized air is supplied via air outlets 411 in the housing portion. It will be appreciated that in other embodiments pressurized air could instead (or in addition) be supplied via openings in the spherical bearing portion 408. It will also be appreciated that the use of air is not critical, and other gases can be used as desired.

It will be appreciated that during wafer processing operations, the process chamber will be held under high vacuum conditions (e.g., $1 \times 10^{-5}$ to $1 \times 10^{-7}$ Torr), while conditions outside the process chamber are at ambient conditions. Thus, the wafer manipulation end 406 of the shaft portion 402 is subject to high vacuum conditions while the actuation end 404 of the shaft portion 402 is subject to ambient conditions. Likewise, a first side 408a of the spherical bearing portion 408 is subject to high vacuum conditions while a second side 408b is subject to ambient conditions. Due to the existence of such a high differential pressure across the spherical bearing portion 408, gases from the ambient atmosphere and from the air bearing will tend to migrate to the process chamber, causing contamination and adversely affecting process chamber conditions. An appropriate sealing arrangement may, therefore, be provided across the spherical bearing portion 408 so that air from the air bearing or from the ambient atmosphere does not enter the process chamber during operation.

Figure 6C:
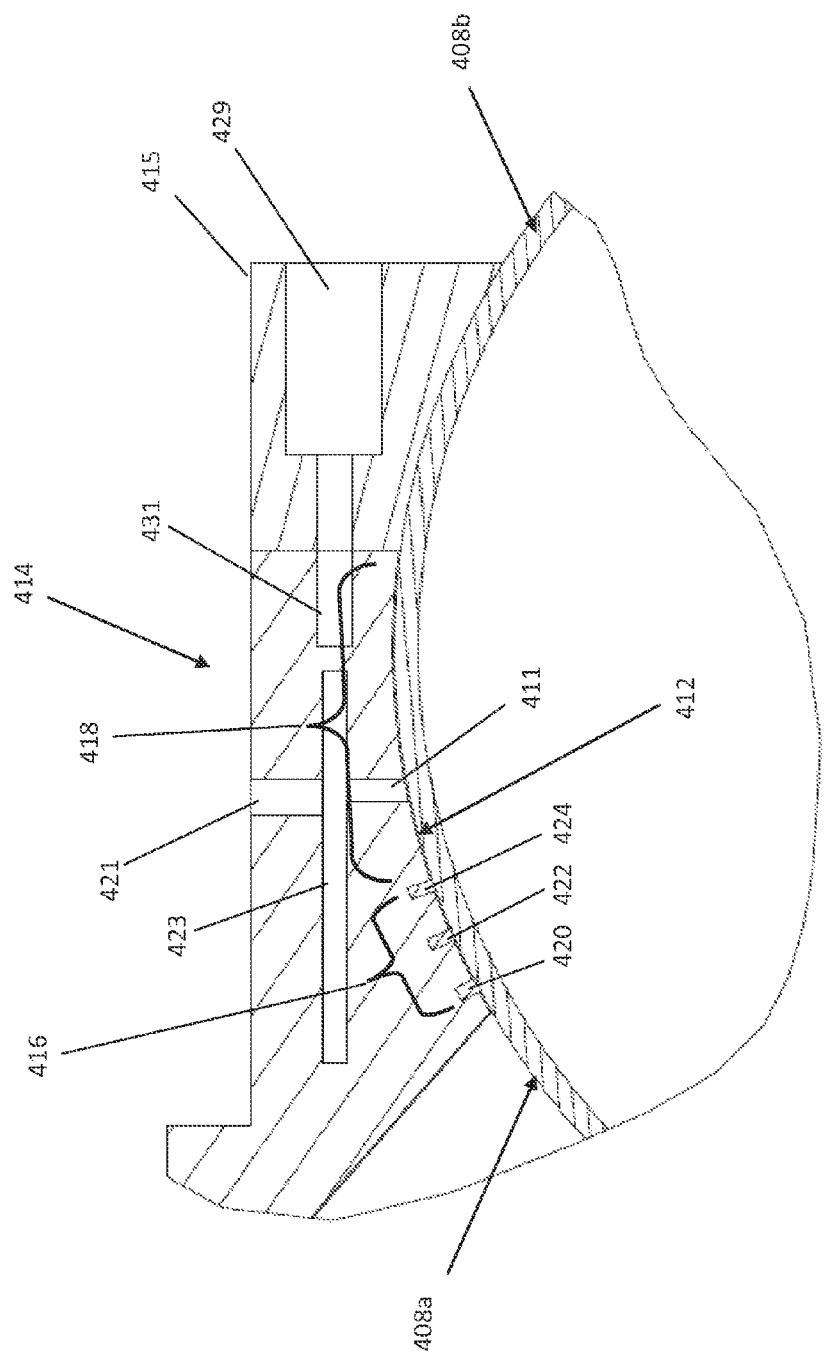
FIG. 6C is a detail cross-section view of a portion of the wafer manipulation assembly shown in FIG. 5.

Referring to FIGS. 6A-6C, the air bearing and sealing functionality of the workpiece adjustment assembly 400 will be described in greater detail. To provide a seal against the ingress of air or other gas into the process chamber during operation, a differential pumping region 416 may be provided in a portion of the housing recess 412 that is adjacent to the process chamber side of the housing 414.

The differential pumping region 416 may include a plurality of grooves 420, 422, 424 (FIG. 6C) formed in the spherical recess 412 of the housing 414. These grooves 420-424 may be arranged to form individual continuous openings surrounding the spherical bearing portion 408. In some embodiments, the grooves 420-424 are not circular, but rather they form individual hourglass shaped grooves that conform generally to the hourglass shape of the housing cutout 471 (FIG. 4). This arrangement allows the grooves 420-424 to be placed as close to the process chamber side of the housing 414 as practical. Such an arrangement allow for the maximum amount of bearing surface area to be devoted to an air bearing portion 418 (FIG. 6C) of the housing. As will be appreciated, maximizing the air bearing surface area maximizes the load bearing capacity of the air bearing.

The back ends of the grooves 420, 422, 424 may be coupled to openings 419 in the housing 414 (FIG. 6B), and then to a suction source, or sources, (not shown) configured to draw gas out through the grooves. Thus, any air or other gas traveling from the ambient and/or between the spherical bearing portion 408 and the spherical recess 412 will be drawn out through the grooves 420-424 before reaching the process chamber, thus minimizing or eliminate entry of gas from the air bearing or the ambient atmosphere to the process chamber.

It will be appreciated that although the illustrated embodiment employs a differential pumping region to seal the process chamber from the ambient and the air bearing, other sealing arrangements could be used. For example, a lip seal arrangement could be used in lieu of, or in addition to, the series of pumped grooves. In addition, greater or fewer than three grooves could be used, as desired.

As noted, an air bearing arrangement may be used to support the spherical bearing portion 408 and its associated components within the housing 414. FIG. 6C shows an exemplary air supply arrangement in which a high pressure air supply port 421 and a circumferentially shaped high pressure air manifold 423 are disposed within the housing 414. The supply port is connected to a high pressure air supply (not shown) for providing high pressure air to the manifold 423. A plurality of circumferentially spaced air outlets 411 are coupled to the high pressure air manifold 423 for receiving the high pressure air and for directing it to the interface region between the spherical recess 412 and the spherical bearing portion 408 (i.e., region 418).

Thus arranged, high pressure air supplied via supply port 421 is distributed to the manifold 423 and then to a plurality of air outlets 411, resulting in the formation of a thin layer of air (an air bearing) between the spherical bearing portion 408 and the spherical housing recess 412. It will be appreciated that air pressure can be supplied at any of a variety of pressures required to support the spherical bearing portion 408 and its associated components during operation. In some embodiments the air pressure may be in the range of about 70 pounds per square inch (psi) to about 90 psi. Other values, may of course be used.

It will be appreciated that when the process chamber is being held at a high vacuum condition, atmospheric pressure will apply a force to the second side 408b spherical bearing portion 408, which hold the bearing portion within the spherical recess 412 of the housing portion 414. As the process chamber is vented, the differential pressure between the process chamber and the ambient atmosphere will decrease, thus reducing the force holding the bearing within the housing. To accommodate this, one or more spherical air pads 415 may be used to maintain the relative positioning of the spherical bearing portion 408 within the spherical recess 412 when there is not high vacuum inside the process chamber.

In one embodiment the spherical air pads 415 are positioned adjacent to the housing portion 414 opposite the process chamber. The spherical air pads 415 can each have an inner surface sized and shaped to correspond to the spherical surface of the bearing portion 408. Similar to the recess 412, the pads 415 can have a plurality of openings (not shown) through which pressurized air (or other appropriate gas) can be supplied in a manner similar to that described in relation to the main air bearing arrangement. One or more exterior high pressure air supply ports 425 may be used to direct air from a high pressure source (not shown) into the spherical air pad 415. The illustrated embodiment shows a pair of spherical air pads 415. It will be appreciated, however, that the number of discrete pads is not critical. In addition, the pads 415 are shown as being coupled to the housing 414 via plurality of fasteners 427 disposed in openings 429, 431 in the pads and the housing, respectively. The coupling arrangement, likewise, is not critical and other coupling techniques may be used, provided they enable maintenance of a desired air gap between the pad and spherical bearing portion 408 sufficient to maintain a desired air bearing "lift."

The air source used to supply air to the spherical air pads 415 may be the same or different from the air source used to provide air to the spherical recess 412 of the housing portion 414. In one embodiment, a control can be provided so that air is supplied to the spherical air pads 415 only when the pressure in process chamber rises above a predetermined threshold. In another embodiment, the control may supply air at increasing pressure and/or flow rate as the pressure in the process chamber increases from its operational high vacuum state. In other embodiments air may be constantly supplied to the spherical air pads 415, even when the process chamber is in its high vacuum state.

As will be appreciated, the disclosed workpiece adjustment assembly 400 facilitates manipulation of a wafer, with four degrees of freedom, within a high vacuum process chamber. That is, the assembly 400 will enable movement of the wafer support 410 (and thus a wafer) in virtually any orientation allowed by the interaction of the spherical bearing portion 408 and the spherical recess 412 of the housing 414.

It will also be appreciated that the disclosed assembly 400 can be used in any of a variety of orientations. For example, the assembly may be oriented so that the shaft portion 402 is held in a substantially vertical position, and a wafer support 410 may be positioned at the end 406 of the shaft portion and oriented perpendicular to the shaft axis. In such an arrangement, the spherical bearing portion 408 may allow the disk to spin about the shaft axis, and may also allow the disk to be tilted with respect to the shaft axis. Other permutations are contemplated.

Figure 7:
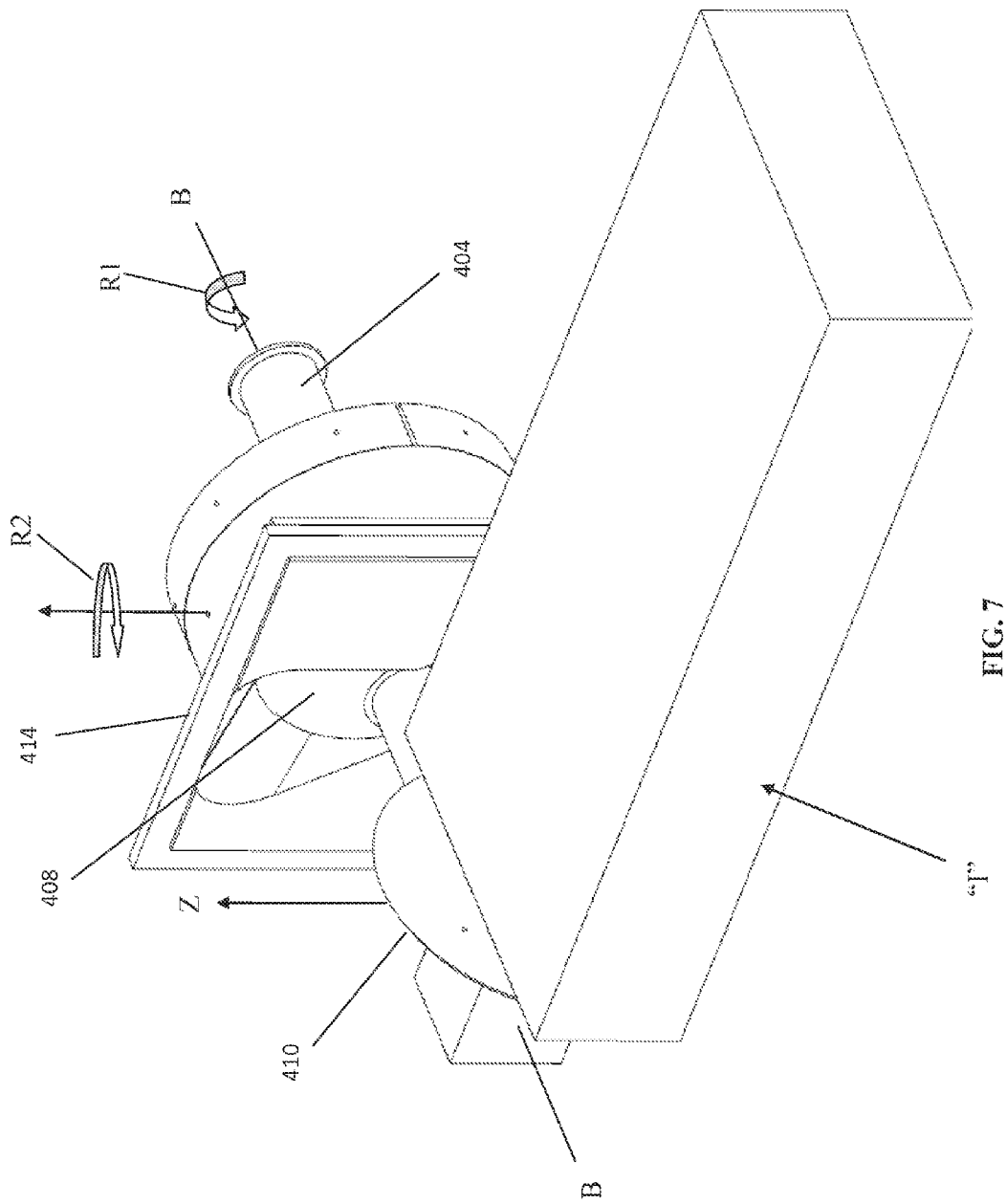
FIG. 7 is an isometric view showing the positioning of a wafer during ion implantation using the wafer manipulation assembly of FIG. 4.

Referring to FIG. 7, the disclosed workpiece adjustment assembly 400 enables scanning a wafer (which would be positioned on the wafer support 410) through an ion beam "I" in the Z-direction. As will be appreciated, the ion beam "I" remains stationary while the wafer support 410 moves the wafer through the beam. In addition, in the FIG. 7 illustration, the wafer support 410 may not move the wafer support 410 along the Z-axis, as some in-plane rotation of the wafer support will be experienced as the spherical bearing portion 408 rotates within the housing 414 (see FIG. 11).

Figure 8:
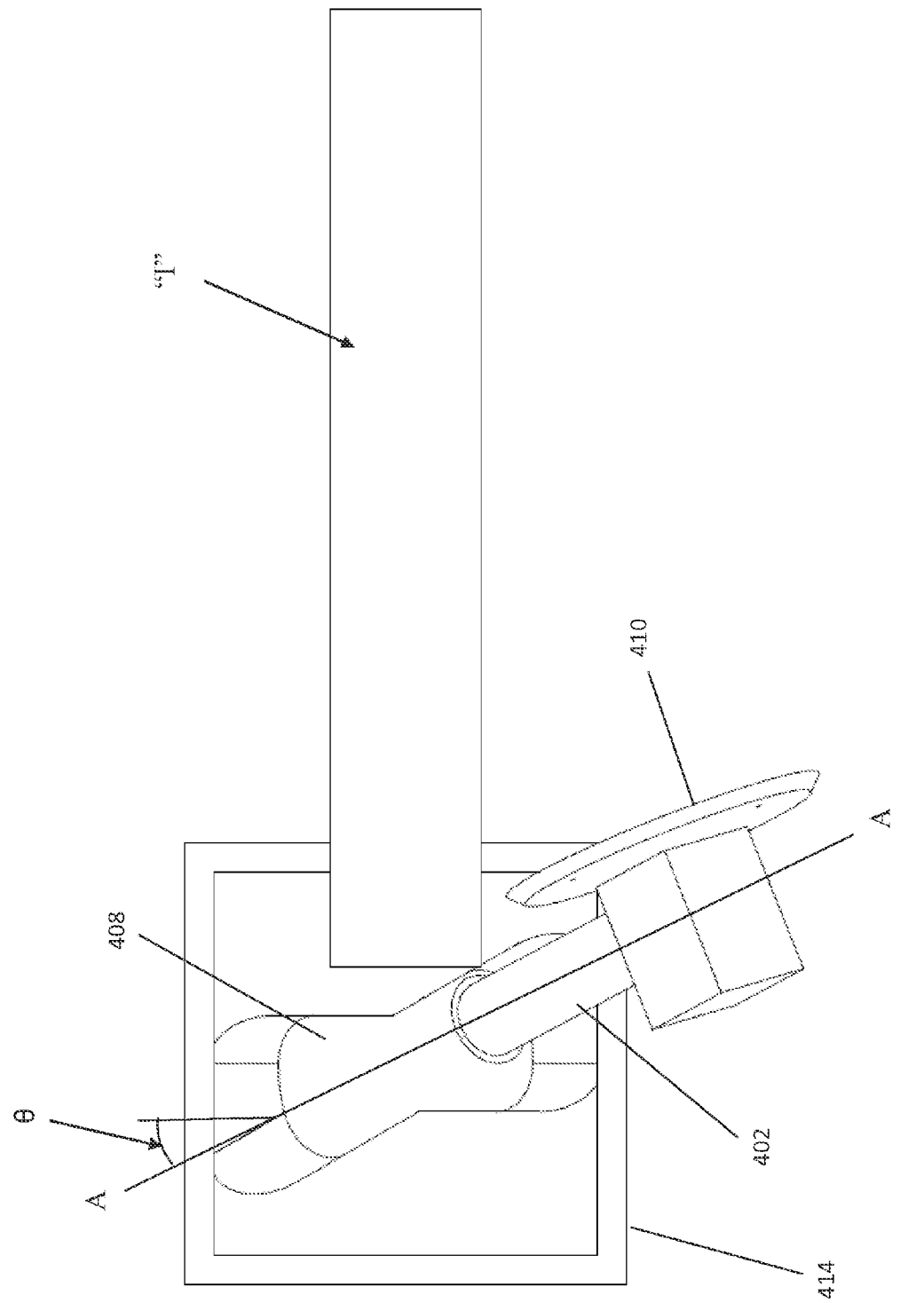
FIG. 8 is an end view showing an alternative positioning of the wafer during ion implantation using the wafer manipulation assembly of FIG. 4.
Figure 9:
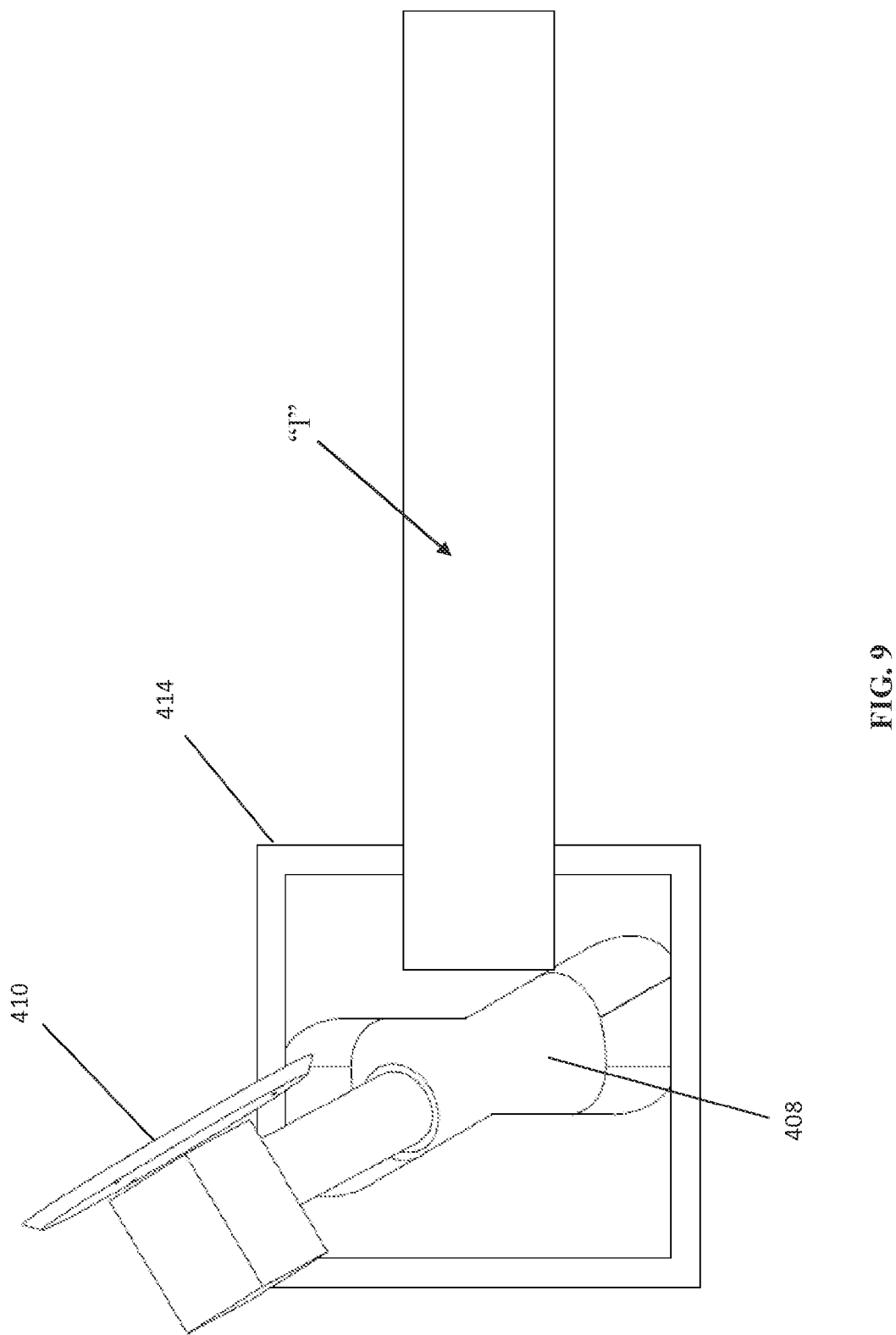
FIG. 9 is an end view showing a further alternative positioning of the wafer during ion implantation using the wafer manipulation assembly of FIG. 4.

As shown in FIGS. 8 & 9, the workpiece adjustment assembly 400 also facilitates movement of the wafer support 410 to allow for isocentric scanning of a wafer through the ion beam "I." FIG. 8 shows the positioning of the wafer support 410 at the "bottom" of an isocentric scan, while FIG. 9 shows the positioning of the wafer support 410 at the "top" of an isocentric scan. Between those two positions the wafer support 410 is moved along axis "A-A" through the ion beam "I." In addition, as compared to the configuration of FIG. 7 in which the wafer support 410 is oriented perpendicular the ion beam "I," in the FIG. 8-9 arrangement the wafer is tilted by an isocentric angle "θ" as measured from a plane oriented perpendicular to the ion beam "I".

Figure 10:
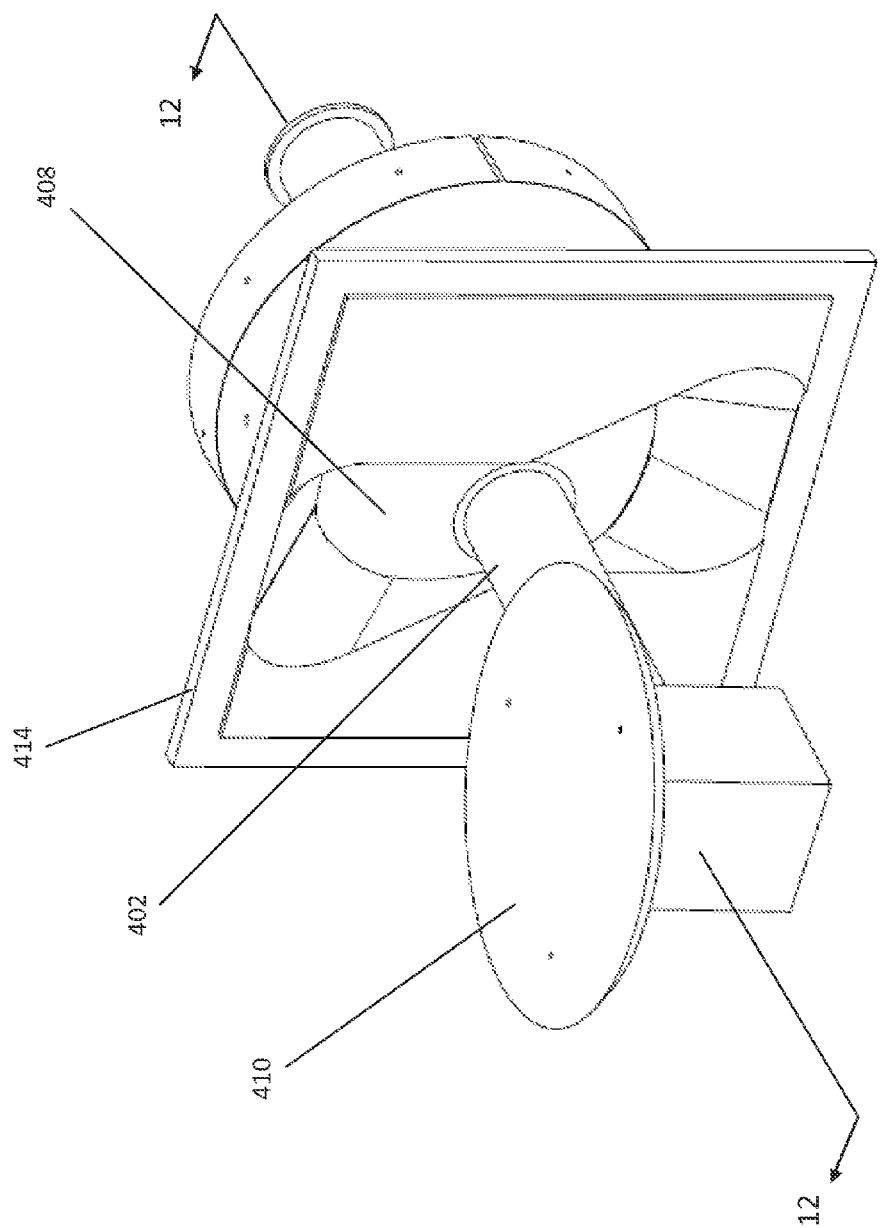
FIG. 10 is an isometric view of a wafer load/unload position of the wafer manipulation assembly of FIG. 4.

The assembly 400 can also allow rotational movement of the wafer support 410 about the longitudinal axis "B-B" of the shaft portion 402 (FIG. 7), thus enabling rotation (shown as arrow "R1") of a wafer about a horizontal implant plane (X). This type of rotational adjustment is included in the configurations shown in FIGS. 8 and 9. FIG. 7 shows the assembly 400 may further allow orthogonal rotation of the wafer support 410 (shown as arrow "R2") of a wafer about a vertical implant plane (Y). In addition, by rotating the shaft portion 404 about its longitudinal axis "B-B" the wafer allows for loading and unloading of the wafer from the wafer support 410. This position is shown in FIG. 10, in which the wafer support 410 is rotated 90-degrees compared to the "implant" position shown in FIG. 7.

Figure 11:
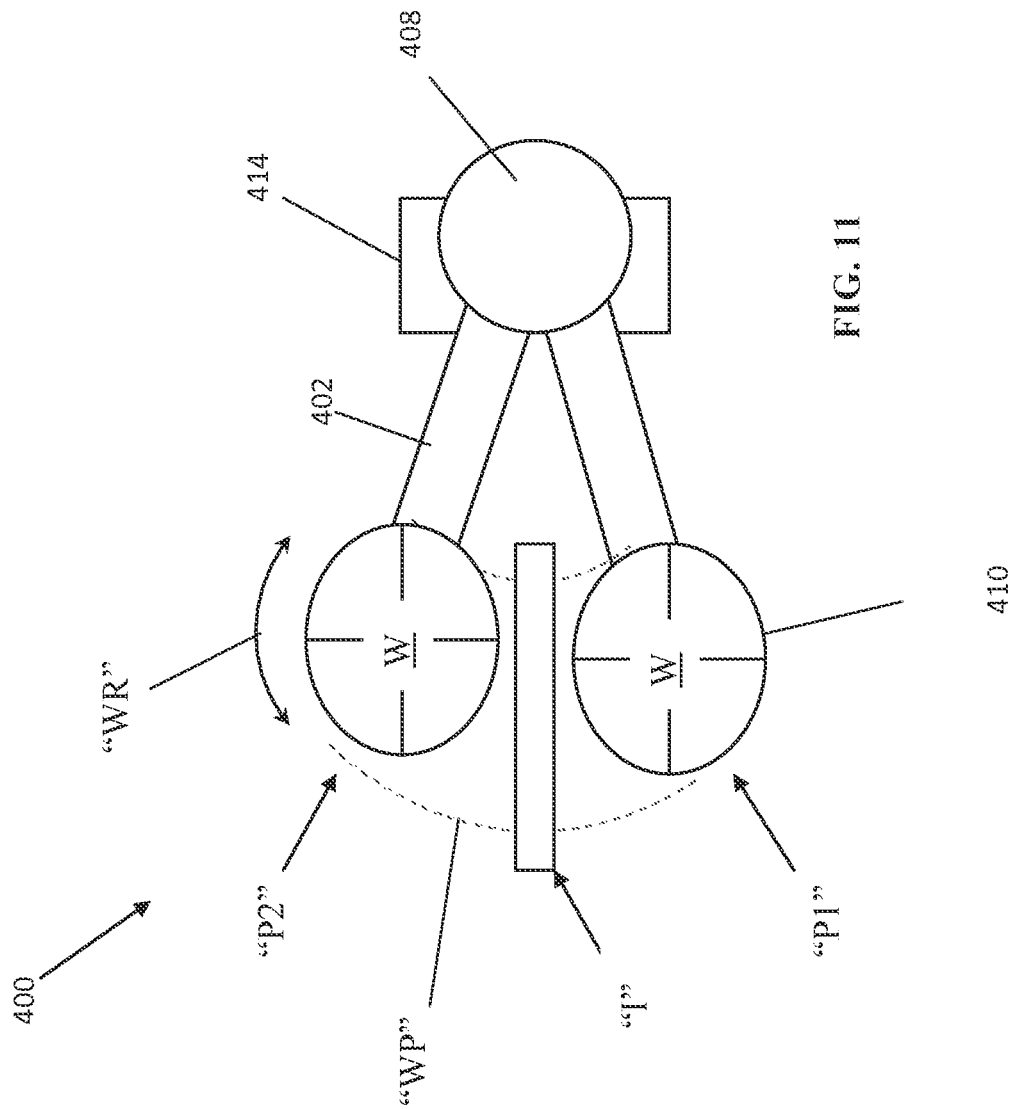
FIG. 11 is a schematic representation of the rotational movement of a wafer with respect to an ion beam using the wafer manipulation assembly of FIG. 4.

Referring now to FIG. 11, the workpiece adjustment assembly 400 is shown moving a wafer "W" through an ion beam "I" (between position "P1" and position "P2"). This motion is constrained by the spherical bearing portion 408 rotating within the spherical recess 412 of the housing 414, such that the wafer "W" moves in an arcuate path "WP" as shown. As it moves along this path, the wafer "W" rotates (in the direction of arrow "WR") with respect to the ion beam. It may, however, be desirable from a process standpoint to prevent the wafer "W" from rotating as it passes through the ion beam "I." To accommodate this, the wafer "W" may be rotated in a direction opposite that of the scan motion in order to zero out any rotational component relative to the beam.

In some embodiments, it may be desirable to allow the shaft portion 404 to move with respect to the spherical bearing portion 408. For example, and as shown in FIG. 11, as the wafer "W" is scanned through the ion beam "I" it travels along an arcuate path "WP." As such, the center of the wafer does not travel along a linear path through the ion beam "I." In some cases it is desirable to provide linear movement of the wafer through the ion beam. Such linear movement can be achieved by extending or retracting the shaft portion 404 along its axis "B-B" as the wafer "W" is scanned through the beam. Through careful calibration and control during wafer scanning, this extension or retraction of the shaft portion 404 can cancel the non-linear component of the scanning motion caused by the rotation of the spherical bearing portion 408. Thus, in some embodiments the shaft portion 404 may be linearly movable with respect to the spherical bearing portion 408 (i.e., in the direction of axis B-B as shown in FIG. 7).

Figure 12:
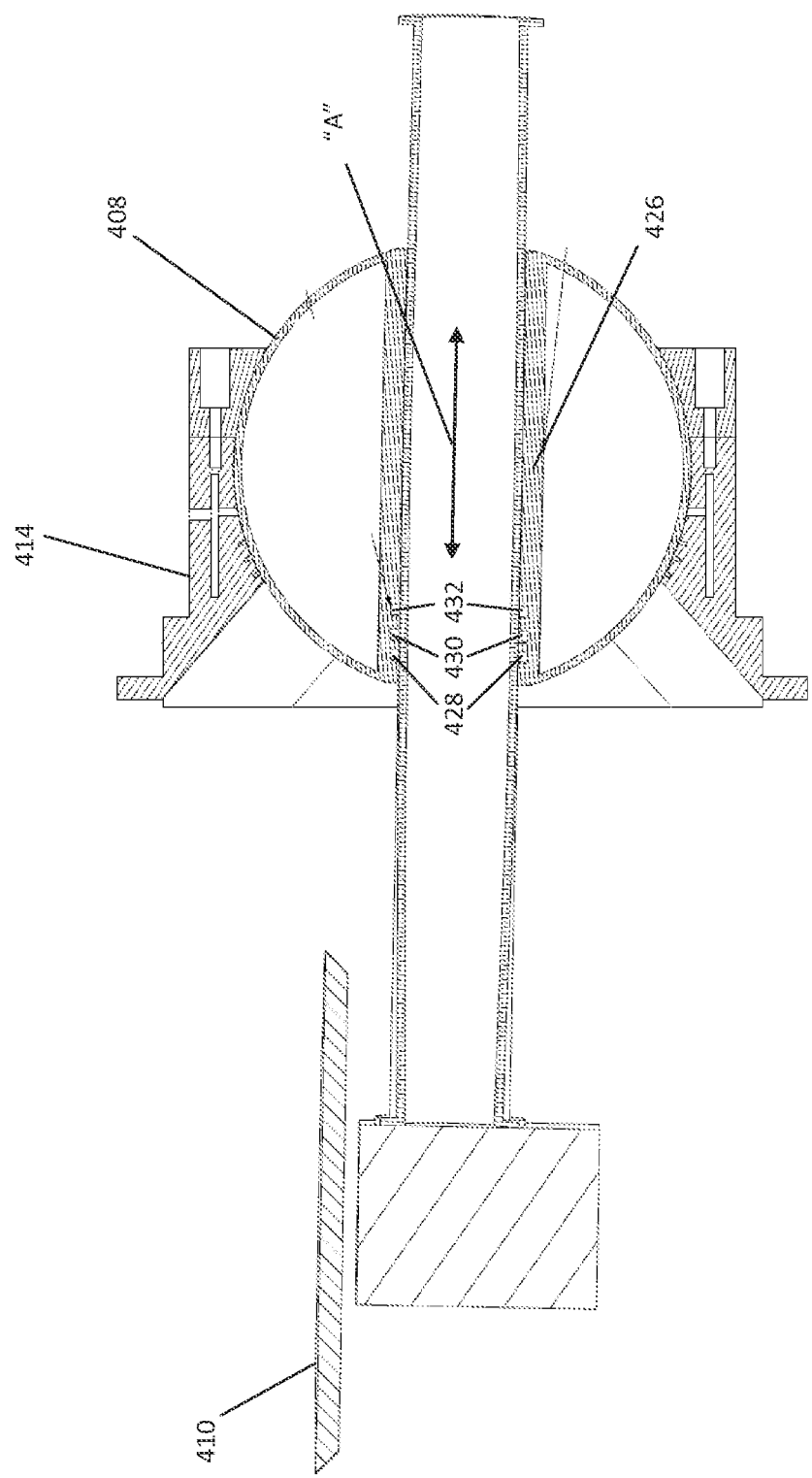
FIG. 12 is a cross-section view of the wafer manipulation assembly of FIG. 10, taken along line 12-12.

Referring to FIG. 12, an arrangement is shown in which the shaft portion 404 is linearly movable with respect to the spherical bearing portion 408. Specifically, the shaft portion 404 is movable in the direction identified in each figure by arrow "A." The shaft portion 404 may be supported within the spherical bearing portion 408 by an air bearing, a bushing or a linear bearing 426. In the embodiment shown in FIG. 11, the shaft portion 404 is slidably coupled to the spherical bearing portion 408 via bearing 426. To seal the two, a seal arrangement such as a series of pumped grooves, standard lip seals or a flexible bellows. In the illustrated embodiment, a plurality of circumferential grooves 428, 430, 432 are provided adjacent to the process chamber side of the assembly. The rear surfaces of the grooves 428-432 may be coupled to a suction source, or sources, configured to draw gas out through the grooves. This arrangement may minimize or eliminate entry of gas from the air bearing (if used) or the ambient atmosphere to the process chamber.

Although not shown, the actuation end 404 may be coupled to an appropriate control system to provide the desired movement of the wafer support 410. The control system may include any one or combination of a variety of actuation elements, including magnetic motor arrangements, rotary cam arrangements, a linear ball screws, and the like. Alternatively, a curved linear motor and curved linear bearing arrangement could be used. Control may be through a servo actuator with encoder feedback for position determination. Linear motion of the shaft portion, if desired, could be through a linear motor and linear bearing arrangement that travels on the curved linear motor and bearing arrangement.

It will be appreciated that the materials constituting the air bearing (i.e., the spherical bearing member 408 and the portion of the housing constituting the housing recess 412 can include graphite. In one embodiment, the material can be graphite with discrete openings formed therein for delivering air to the air bearing. Alternatively, the material may be porous graphite in which air is distributed to the bearing area through the pores in the material.

Figure 13:
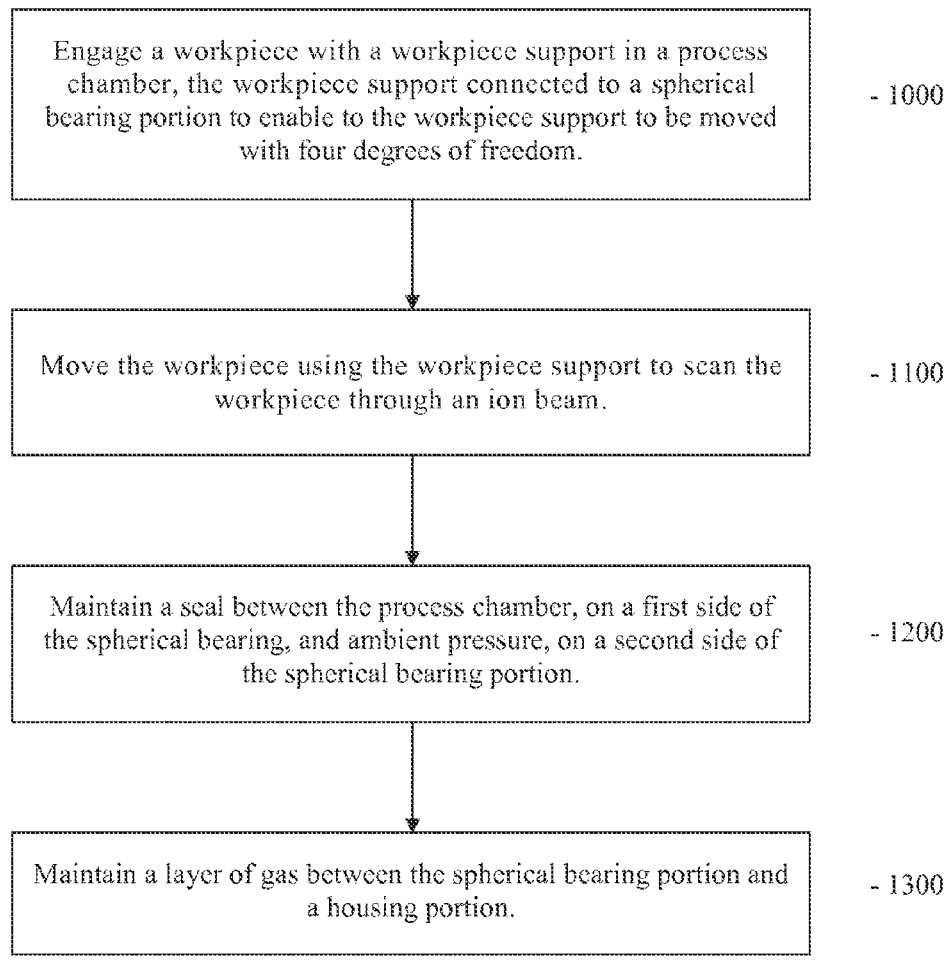
FIG. 13 is a flowchart illustrating an exemplary method according to the disclosure.

Referring now to FIG. 13, a method according to the disclosure will be described. At step 1000, a workpiece such as a semiconductor wafer is engaged with a workpiece support in a process chamber. The process chamber may be in a high vacuum condition (e.g., $1 \times 10^{-5}$ to $1 \times 10^{-7}$ Torr). At step 1100, the workpiece support moves the workpiece so that it is scanned through an ion beam. The workpiece support is moved by manipulating a spherical bearing portion that is connected to the workpiece support. In one embodiment scanning the workpiece comprises isocentric scanning. In other embodiments, scanning the workpiece comprises translating the workpiece support with respect to the spherical bearing portion. In yet other embodiments scanning the workpiece comprises rotating the workpiece support with respect to the spherical bearing. In some embodiments the spherical bearing portion is configured to enable to the workpiece support to be moved with four degrees of freedom. At step 1200, a seal is maintained between the process chamber on a first side of the spherical bearing portion and ambient pressure on the second side of the spherical bearing portion. This step may be performed simultaneous to the scanning step. At step 1300, an air bearing may be maintained between the spherical bearing portion and a housing portion. This step may be performed simultaneous to the scanning and sealing steps.

As will be appreciated, the disclosed workpiece adjustment assembly 400 does not require any additional bearing structures to enable the described motions. This is an advantage over existing designs which require multiple separate bearing elements to achieve similar wafer movements.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. While the invention has been disclosed with reference to certain embodiments, numerous modifications, alterations and changes to the described embodiments are possible without departing from the spirit and scope of the invention, as defined in the appended claims. Accordingly, it is intended that the present invention not be limited to the described embodiments, but that it has the full scope defined by the language of the following claims, and equivalents thereof.

What is claimed is:

1. A workpiece adjustment assembly, comprising:
   a shaft portion having an actuation end and a wafer manipulation end;

a spherical bearing portion coupled to the shaft portion between the actuation end and the wafer manipulation end;

a wafer support coupled to the wafer manipulation end of the shaft portion;

a housing portion for receiving the spherical bearing portion and for enabling the spherical bearing portion to rotate therein, the housing portion having a plurality of openings adjacent the spherical bearing portion for providing a pressurized gas between the housing portion and the spherical bearing portion to form a film of said pressurized gas between the spherical bearing portion and the housing portion to prevent solid-to-solid contact between the spherical bearing portion and the housing portion during operation;

the shaft portion extending through an hourglass-shaped recess in the housing portion located on one side of the spherical bearing portion; and a seal disposed in the housing portion for preventing the pressurized gas from migrating to a process chamber side of the housing portion;

wherein the spherical bearing portion enables the wafer manipulation end to be moved with four degrees of freedom.

2. The workpiece adjustment assembly of claim 1, wherein the seal comprises a plurality of grooves disposed in the housing portion, the grooves facing the spherical bearing portion, the grooves coupled to a suction source for drawing gas from a space between the housing portion and the spherical bearing portion.

3. The workpiece adjustment assembly of claim 2, wherein the plurality of grooves are disposed between the plurality of openings and a vacuum chamber side of the housing portion.

4. The workpiece adjustment assembly of claim 1, further comprising an air bearing pad disposed adjacent to an ambient side of the portion, the air bearing pad comprising a plurality of openings adjacent the spherical bearing portion for providing a pressurized gas between the air bearing pad and the spherical bearing portion.

5. The workpiece adjustment assembly of claim 4, wherein the air bearing pad comprises a plurality of spherical air bearing pads coupled to a control, the control for supplying air to the spherical air bearing pads with at least one of increasing pressure and increasing flow rate as the pressure in the process chamber side of the housing portion increases from an operational high vacuum state.

6. The workpiece adjustment assembly of claim 1, wherein the shaft portion is axially fixed in relation to the spherical bearing portion.

7. The workpiece adjustment assembly of claim 1, wherein the shaft portion is axially and rotationally movable in relation to the spherical bearing portion.

8. The workpiece adjustment assembly of claim 1, wherein the shaft portion is received through an opening in the spherical bearing portion, the spherical bearing portion further comprising a plurality of openings for providing a pressurized gas to form a film of said pressurized gas between the shaft portion and the spherical bearing portion.

9. The workpiece adjustment assembly of claim 8, further comprising at least one groove disposed in the spherical bearing portion, the groove facing the shaft portion, the grooves coupled to a suction source for drawing gas from a space between the spherical bearing portion and the shaft portion.

10. The workpiece adjustment assembly of claim 1, wherein the wafer support is rotatable in relation to the shaft portion.

11. A workpiece adjustment assembly comprising:

a shaft portion having an actuation end and a wafer manipulation end;

a spherical bearing portion connected to the shaft portion;

a wafer support coupled to the wafer manipulation end of the shaft portion;

a housing portion having a vacuum chamber side and an ambient side, the housing portion including a spherical recess adjacent to the ambient side for receiving the spherical bearing portion, the housing portion forming an air bearing with the spherical bearing portion, the air bearing comprising a film of pressurized air between the spherical bearing portion and the housing portion to prevent solid-to-solid contact between the spherical bearing portion and the housing portion during operation, the pressurized air provided via an opening in at least one of the housing portion and the spherical bearing portion;

the shaft portion extending through an hourglass-shaped recess in the housing portion located on one side of the spherical bearing portion; and a seal disposed in the housing portion for preventing gas from migrating to the vacuum chamber side of the housing portion;

wherein the spherical bearing portion enables the wafer manipulation end to be moved with four degrees of freedom.

12. The workpiece adjustment assembly of claim 11, wherein the seal comprises a plurality of grooves in the housing portion facing the spherical bearing portion, the grooves for drawing gas from a space between the housing portion and the spherical bearing portion.

13. The workpiece adjustment assembly of claim 12, wherein the plurality of grooves are positioned between the opening associated with the air bearing and the vacuum chamber side of the housing portion.

14. The workpiece adjustment assembly of claim 11, further comprising an air bearing pad disposed adjacent to the ambient side of the housing portion, the air bearing pad comprising a plurality of openings for providing a gas layer between the air bearing pad and the spherical bearing portion.

15. The workpiece adjustment assembly of claim 14, wherein the air bearing pad comprises a plurality of spherical air bearing pads coupled to a control, the control for supplying air to the spherical air bearing pads with at least one of increasing pressure and increasing flow rate as the pressure in the vacuum chamber side of the housing portion increases from an operational high vacuum state.

16. The workpiece adjustment assembly of claim 11, wherein the shaft portion is rotationally movable in relation to the spherical bearing portion.

17. The workpiece adjustment assembly of claim 11, wherein the shaft portion is axially movable in relation to the spherical bearing portion.

18. The workpiece adjustment assembly of claim 11, wherein the wafer support is rotatably coupled to the wafer manipulation end of the shaft portion.

19. The workpiece adjustment assembly of claim 11, wherein the shaft portion is received through an opening in the spherical bearing portion, the spherical bearing portion further comprising a plurality of openings for providing a pressurized gas to form a film of said pressurized gas between the shaft portion and the spherical bearing portion.

20. The workpiece adjustment assembly of claim 19, further comprising at least one groove disposed in the spherical bearing portion, the at least one groove facing the shaft portion and coupled to a suction source for drawing gas from a space between the spherical bearing portion and the shaft portion.

\* \* \* \* \*